United States Patent [19]

Raso et al.

[11] 3,931,533

[45] Jan. 6, 1976

[54] ULTRASONIC SIGNAL GENERATOR

[75] Inventors: Frank A. Raso, Spencerport; John J. Saeli, Rochester, both of N.Y.

[73] Assignee: Sybron Corporation, Rochester, N.Y.

[22] Filed: May 30, 1974

[21] Appl. No.: 474,359

[52] U.S. Cl. .................... 310/8.1; 318/116; 310/26

[51] Int. Cl.[2] ........................................ H01L 41/10

[58] Field of Search ....... 310/8.1, 26; 318/116, 118; 331/116 R, 116 M

[56] References Cited

UNITED STATES PATENTS

| | | | |
|---|---|---|---|
| 2,498,760 | 2/1950 | Kreithen | 318/118 UX |
| 2,752,512 | 6/1956 | Sarratt | 310/8.1 |
| 2,917,691 | 12/1959 | De Prisco et al. | 318/118 |
| 3,489,930 | 1/1970 | Shoh | 310/8.1 |
| 3,629,726 | 12/1971 | Popescu | 310/26 X |
| 3,668,486 | 6/1972 | Silver | 318/116 |
| 3,694,713 | 9/1972 | Duren et al. | 318/116 |
| 3,727,112 | 4/1973 | Popescu | 310/26 X |

*Primary Examiner*—Mark O. Budd
*Attorney, Agent, or Firm*—Theodore B. Roessel; J. Stephen Yeo

[57] ABSTRACT

A controllable frequency ultrasonic signal generator for driving an ultrasonic transducer via a switching type output circuit for the efficient transfer of energy thereto. The signal generator includes a phase lock loop feedback control for locking the operation of the oscillator to the resonant frequency of the transducer for following variations in transducer resonant frequency due to loading changes, temperature changes, tool tip variations, and the like.

6 Claims, 2 Drawing Figures

ULTRASONIC SIGNAL GENERATOR

BACKGROUND ON THE INVENTION

This invention pertains to electrical circuits for driving ultrasonic transducers, and more particularly to controllable oscillator circuits for energizing ultrasonic transducers at their resonant frquency and for following any changes therein.

Ultrasonic devices have a wide variety of uses in the form of hand held tools for drilling, cleaning, etc., surfaces such as, for example, dental ultrasonic scalers. The hand tool generally includes a transducer for driving a vibratory tip and a circuit for energizing the transducer. The transducer can be a magnetostrictive type including an energizing coil, or a piezoelectric type to which electrical ultransonic signals are directly applied. Since the tool is handheld, it is important that the tool, when energized, remains at a comfortable temperature, particularly when used over extended periods of time. This is particularly true in the case of the dental ultrasonic scalers due to the exacting nature of the work involved.

A coolant, such as water, is generally circulated through the hand tool to maintain the temperature of the hand tool comfortable. In the case of dental ultrasonic scalers, the water is projected out from the end of the hand tool and along the tip to provide a flushing action to enhance cleaning. However, care must be taken so that the flow of water into the patient's mouth is not greater than the evacuation capacity of the dental system. If the water flow is greater than the capacity of the evacuation system, the dentist, or his assistant, is required to periodically shut off the tool and allow the water to be drawn off. This is particularly true in the case of older type dental chairs wherein the evacuation capacity may be insufficient. This requirement for periodically stopping the cleaning procedure is annoying to the dentist, is also inefficient requiring additional time for the cleaning procedure, and perhaps uncomfortable to the patient.

The combination of the transducer (coil and magnetostrictive element) and tool tip generally has a natural resonant frequency characteristic. the resonant frequency characteristic generally has a bell shape. A low "Q" curve exhibits a wider frequency range with lower amplitude than a high Q curve. The transducer is driven within the resonant frequency characteristic. The higher the Q of the transducer the greater the excursion for a given input power level and therefore greater efficiency. Hence, it is highly desirable to use as high a Q transducer as possible and drive the tool within the resonant frequency band to assure high efficiency of operation and less power dissipation. In the case of a coil driven magnetostrictive unit, it is desirable to reduce the resistance of the coil as low as possible to increase the Q of the transducer and to also reduce the power dissipated within the coil.

The resonant frequency characteristic of the combined transducer and tip varies for a variety of reasons. For example, loading of the tool tip and temperature variations tend to vary its resonant frequency characteristic both amplitude and frequency wise. In addition, depending upon the type of operation to be performed, tool tip changes may be required or desired. The hand tool often includes several different types of tips that can be interchanged to provide the desired operating function. Any change in the tip structure will also change the resonant frequency characteristic of the combination.

In the prior art, the transducer and tip combination were designed as a compromise so that the transducer can be driven by an oscillator without resulting in a lockout condition, i.e., insufficient power transfer load to assure resonance. A U.S. Pat. No. 3,629,726 entitled "Oscillator and Oscillator Controlled Circuit", issued on Dec. 21, 1971, to Gabriel Popescu, disclosed an oscillator circuit including current and voltage feedback circuits that functioned to allow the band pass of the transducer and tip combination to be narrowed from that previously used, by controlling the frequency of an oscillator to the resonant frequency of the transducer. Although the circuit disclosed in the cited patent did provide improved power transfer and allowed the use of higher Q circuits, it still did not provide the degree of efficiency desired to assure that the temperature of the hand tool would be maintained within the comfortable range, nor did it provide for a low level of water flow so that the tool can be used continuously even with the older type dental chairs. Furthermore, in the arrangement disclosed, high voltage and high currents levels are required, further adding to the power level requirements and to the cost of the control devices needed to assure long life operation under such conditions.

It therefore would be highly advantageous if a higher Q transducer could be efficiently driven by a low voltage level generator circuit and that could accurately follow small variations in the resonant frequency characteristic due to loading effects, temperature changes, tip changes, and the like, and maintain the operation of the transducer at higher efficiency to reduce heating effects in the hand tool.

It is therefore an object of this invention to provide a new and improved ultrasonic signal generator for use with higher Q ultrasonic transducers.

It is also another object of this invention to provide a new and improved ultrasonic signal generator for providing for the more efficient transfer of energy to an ultrasonic transducer and thereby reducing heating of the transducer.

It is still a further object of this invention to provide a new and improved ultrasonic signal generator that accurately follows small changes in the resonant frequency characteristic of a connected transducer due to loading affects, temperature changes, tool changes, and the like.

It is still a further object of this invention to provide a new and improved ultrasonic lower voltage level signal generator that accurately follows small changes in the resonant frequency characteristic of a connected transducer due to loading affects, temperature changes, tool changes and the like.

BRIEF DESCRIPTION OF THE INVENTION

An ultrasonic signal generator for an ultrasonic hand tool including a transducer responsive to electrical ultrasonic signals for transmitting ultrasonic moments to the hand tool output tip. The ultrasonic signal generator includes a controllable oscillator circuit that is responsive to control signals applied thereto to control the frequency of oscillation. The controllable oscillator is connected to energize the transducer. Feedback means provides a feedback signal at the frequency at which the transducer responds to the oscillation signals. The frequency of the feedback signal is compared with the frequency of oscillation for applying the control signal to the oscillator so that the frequency of oscillation maintains a substantially constant phase difference between the feedback signal and the frequency of oscillation. As a result, the oscillation circuit automatically follows the operation of the transducer within the resonant frequency characteristic and changes therein due to loading, temperature changes and changes in configuration of the tool tip.

In accordance with an embodiment of the invention, a phase lock loop feedback system is provided wherein the oscillator circuit accurately tracks the resonant frequency of the transducer to assure that the generator is operating within a small portion of a cycle of the resonant frequency of the transducer.

In accordance with a further feature of the invention, the oscillator circuit is coupled to the transducer via a switching circuit that is alternately driven between cut-off and saturation thereby allowing the efficient use of lower voltages and still provide the power level output necessary to drive the transducer. As a result, the resistance of a transducer coil is reduced thereby increasing the Q of the transducer for more efficient power transfer and reducing the heating of the hand tool.

DETAILED DESCRIPTION OF THE INVENTION

Figure 1:
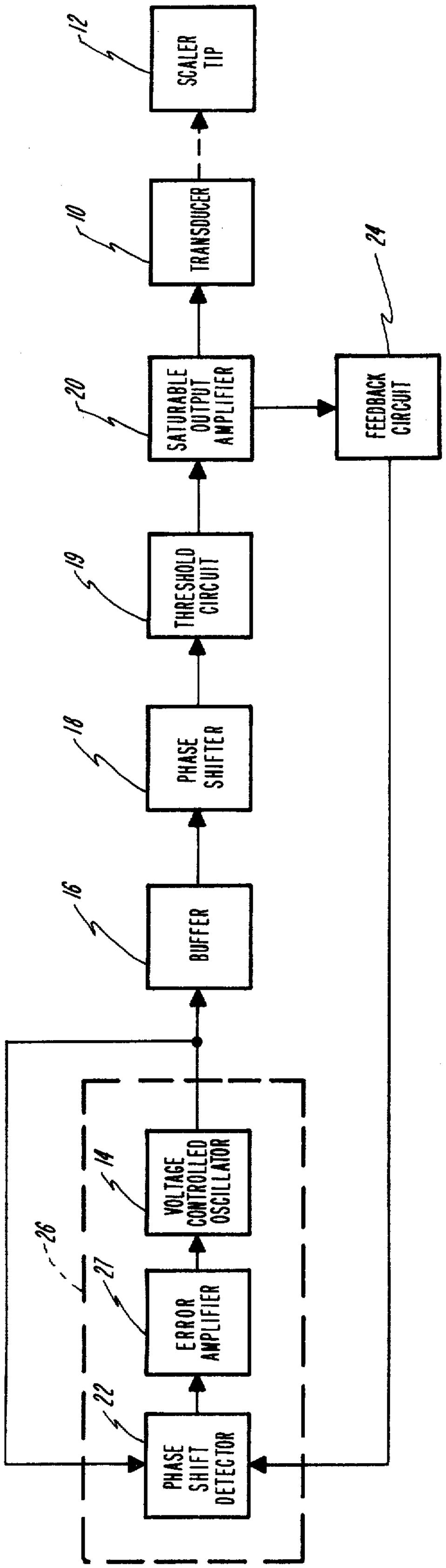
FIG. 1 is a block diagram of an ultransonic hand tool including the ultrasonic signal generator of the invention.

As illustrated in FIG. 1, an ultransonic transducer 10 is connected to an output unit 12, such as for example a dental scaler tip. The combination of the transducer 10 and the scaler tip 12 has a bell shaped resonant frequency characteristic of the type disclosed in the U.S. Pat. No. 3,629,726. The transducer 10 can, for example, include a magnetostrictive element with one end rigidly fastened to the hand tool casing and the other end attached to the scaler tip 12 and with a coil surrounding the magnetostrictive element to impart electromagnetic signals thereto. The magnetostrictive element is responsive to the electromagnetic signals to expand and contract at ultrasonic frequency to provide the desired vibratory motion to the tool tip 12.

The ultrasonic electrical signals for driving the transducer 10 are generated by a voltage controlled oscillator 14, which can for example provide a square wave type output signal. The output of the voltage controlled oscillator is applied via a buffer circuit 16, a phase shift circuit 18, a threshold circuit 19, and a saturable power output amplifier circuit 20, to the transducer 10. The frequency of oscillation of the voltage controlled oscillator 14 is controlled by a phase shift detector circuit 22. A feedback circuit 24 generates a feedback signal having the same frequency as the resonant frequency of the transducer 10. The feedback signal is applied to the phase shift detector 22, which in turn, compares the phase of feedback signal with the phase of the output signal from the voltage controlled oscillator 14 to apply a control signal to the oscillator 14 to maintain a substantially constant present phase relation between the oscillation signal and the feedback signal. The combination of the phase shift detector 22, error amplifier 27, and the voltage control oscillator 14 (enclosed within the dashed block 26) are standard commercially available components, the operation of which is well known. The buffer circuit 16, the amplifier 20 and the threshold circuit 19 provide a switching type of drive circuit at the oscillator frequency thereby providing a low power dissipation drive circuit including inexpensive low power type components. The phase shift circuit 18 provides a ninety degree phase shift needed for phase lock loop operation.

The system of FIG. 1 controls the frequency of oscillation by resonant frequency of the transducer 10 thereby provides a highly accurate tracking arrangement assuring that the transducer 10 is always driven at its resonant frequency despite changes in loading, changes in temperature, and the like. The system of FIG. 1 also automatically compensates for changes in resonant frequency due to changes in the configuration of the scaler tip 10.

Figure 2:
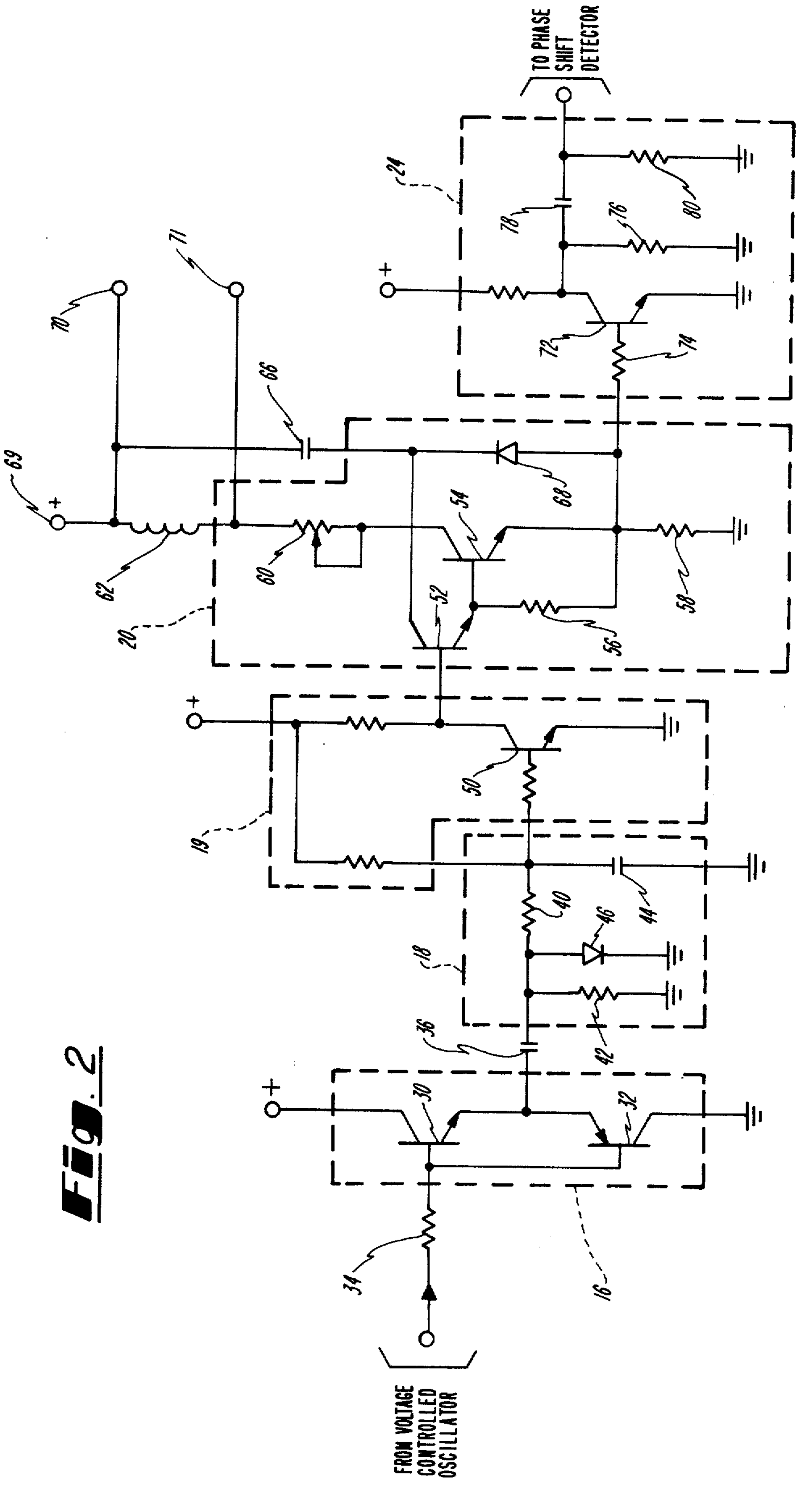
FIG. 2 includes a schematic diagram of a switching circuit interconnecting the voltage controlled oscillator of FIG. 1 to the transducer in accordance with a further feature of the invention.

As illustrated in FIG. 2, the output from the voltage control oscillator 14 is applied to the bases of the transistors 30 and 32, connected as a high gain complimentary emitter follower buffer circuit that provides a low impedance drive that follows the square wave signals from the oscillator 14. The output from the transistors 30 and 32 is applied via an AC coupling capacitor 36 and a divide clamp 46 to the phase shift circuit 18 illustrated as an integrating circuit including the resistors 40 and 42 and a capacitor 44. The diode clamp 46 provides a ground reference for the phase shift circuit. The phase shift circuit 18 converts the square wave output from the transistors 30 and 32 into a sawtooth integrated type wave which is phase shifted in the order of ninety degrees relative to the oscillator circuit output.

The output signal from the phase shift circuit 18 is applied to the threshold circuit 19 including a transistor 50 connected as a high gain DC amplifier. The arrangement is such that when a sawtooth wave from the phase shift circuit 18 exceeds the threshold bias level of the transistor 50, the transistor 50 is driven from saturation to cut off. The transistor 50 is switched on and off at the frequency of the oscillator output signal, but phase shifted by ninety degrees. The output signal from the transistor 50 is directly coupled to the power amplifier stage 20, which includes a pair of transistors 52 and 54 connected as a direct coupled Darlington pair. Resistors 56 and 58 provide the bias circuit for the transistor 52 and 54. The collectors of the transistors 52 and 54 are connected via a potentiometer 60 to a transducer coil 62 for exciting the transducer 10 in the ultrasonic frequency range. The other end of the coil 62 is connected to a power supply terminal 64. The potentiometer 60 functions as an excursion control for the transducer 10. A capacitor 66 is connected between the power terminal 64 and the collectors of the transducer 52 and 54 to form a parallel tuned circuit and tune out the inductive component of the coil 62. The diode 68 functions as a commutating diode to protect the transistor 52 and 54 from excessive reverse voltage excursions. The opposite ends of the coil 62 are connected to a power terminal 70 and 71 of an isolated low voltage power supply to bias the coil 62 in a linear portion of its hysteresis curve for maximum permeability and therefor maximum flex excursions with minimum AC input. The transistors 52 and 54 are alternately driven between cut off by the threshold circuit 19 to provide a non-linear switching type of direct circuit for the transducer 10. As previously mentioned, since the transistors 50, 52 and 54 are driven between cut-off and saturation, the transistors operate to dissipate a minimum amount of power and therefor low cost standard transistors and components can be used in the drive circuit minimizing the cost thereof. In addition to the foregoing, it has been found that by using the switching type output amplifier 20, the output circuit could operate at substantially lower voltage levels than the circuit of the U.S. Pat No. 3,629,726 and still provide the needed amount of power to the transducer. As a result, its was found that fewer turns of greater diameter wire could be included in the coil 62 thereby reducing its resistance. Hence, the Q of the transducer could be increased wherein greater excursions could be provided for a given drive signal thereby increasing the efficienty of operation, and that the reduced resistance also resulted in reduced power dissipation in the coil and therefor less heating of the hand tool.

The feedback circuit 24 includes a transistor 72 connected via a resistor 74 to the emittor electrode of the transistor 54. Since the current flow through the emitter resistor 58 is in phase with the current flow through the coil 62, the transistor 72 provides an output signal across a resistor 76 that is in phase with the resonant frequency of the transducer. The feedback signal developed across the resistor 76 is applied to the phase shift detector 22 via a filter circuit including a capacitor 78 and a resistor 80.

The phase lock loop system provides a high gain and accurate arrangement for continuously locking the frequency of the transducer drive signal to that of the resonant frequency of the transducer. Should the resonant frequency of the transducer 10 for any reason change such as for example, loading, temperature changes, and tip change, etc., the phase lock system of the invention automatically shifts the output of the oscillator to that of the resonant frequency, assuring that the output of the oscillator is continuously energized at the resonant frequency and thereby providing a highly accurate tracking function. Since the switching type drive circuit allows the use of lower resistance coils, the Q of the transducer can now be increased. The accurate type tracking system assures that the transducer is continuously driven at its resonant frequency, even dispite changes therein, providing for the continuous efficient transfer of power thereto, reducing power losses in the transducer and thereby reducing the heating effects in the hand tool. As a result the flow of water through the hand tool can be controlled to provide the degree of flushing affect desired without overcoming the evacuation capabilities in the older type dental chairs. In addition to the foregoing, since lower voltage can be used with the switching type output circuit, an added safety factor is gained by the signal generator of the invention.

What is claimed is:

1. An electrical ultrasonic signal generator for a hand tool including a transducer responsive to electrical ultrasonic signals to transmit ultrasonic moments to a tool attached thereto comprising:

controllable oscillator circuit means responsive to a control signal applied thereto for controlling the frequency of oscillation;

circuit means for applying the oscillator circuit means signals to said transducer;

feedback circuit means for generating feedback signals at the frequency at which said transducer responds to the oscillator circuit means signals; and control circuit means for comparing phase of the feedback signals with the said phase oscillator circuit means signals for applying a control signal to said oscillator circuit means that is a function of the phase difference between the feedback and oscillator circuit means signals to maintain the oscillation circuit means signals at a substantially constant preset phase relation with the feedback signals;

wherein said circuit means for applying the oscillator circuit means signals to said transducer includes;

amplifier circuit means responsive to the oscillator circuit means signals for alternately switching between saturation and cut off to apply substantially square wave signals to said transducer.

2. An electrical ultrasonic generator as defined in claim 1 wherein:

said circuit means for applying the oscillator circuit means to said transducer includes a phase shift circuit for shifting the phase of the oscillator circuit means signals applied to said transducer; and said control circuit means maintains the preset phase relation corresponding to phase shift introduced by said phase shift circuit.

3. An electrical ultrasonic generator as defined in claim 2 wherein:

a threshold circuit is connected between said phase shift circuit and said amplifier circuit means for applying phase shifted square wave type signals to said amplifier circuit means for switching said amplifier circuit means between saturation and cut off.

4. An electrical ultrasonic generator as defined in claim 3 wherein:

said feedback circuit means detects the current flow through said transducer to produce the feedback signal.

5. An electrical ultrasonic generator as defined in claim 4 wherein:

said oscillator circuit means is a voltage controlled oscillator for producing substantially square wave signals, the frequency of which is a function of the magnitude and polarity of a direct current control signal applied thereto, and said control circuit means applies the direct current signals to said voltage controlled oscillator.

6. An electrical signal generator for ultrasonic dental scalers having a hand tool with an ultrasonic transducer mounted therein, wherein said transducer includes a mangetostrictive element for connection to a scaler tip and a coil surrounding magnetostrictive element for applying ultrasonic electromagnetic signals thereto, said electrical signal generator comprising:

controllable oscillator circuit means responsive to a control signal applied thereto for controlling the frequency oscillation;

power amplifier circuit means for applying electrical signals to the transducer coil;

phase shift circuit means for phase shifting the oscillation circuit means signals;

threshold circuit means connected between said phase circuit means and said power amplifier circuit means for applying switching signals to said power amplifier circuit means for alternating switching said power amplifier circuit means between saturation and cut off at the frequency of said oscillator circuit means signal;

feedback circuit means for detecting the current flow through said transducer coil and generating a feedback signal at the frequency at which said transducer responds to the signals from said power amplifier circuit means, and control circuit means for comparing the phase of the feedback signal with the phase of the oscillator circuit means signal for applying a control signal to said oscillator circuit means that is a function of the phase difference between the feedback and the oscillation circuit means signals to maintain a substantially constant phase relation between the oscillator circuit means signals and the feedback signals, whereby the frequency of oscillation is controlled by the resonant frequency of the transducer.

* * * * *